United States Patent
Hamza et al.

(10) Patent No.: US 9,481,930 B2
(45) Date of Patent: Nov. 1, 2016

(54) FABRICATION OF DIAMOND SHELLS

(75) Inventors: Alex V. Hamza, Livermore, CA (US); Juergen Biener, San Leandro, CA (US); Christoph Wild, Baden-Wuerttemberg (DE); Eckhard Woerner, Baden-Wuerttemberg (DE)

(73) Assignee: Lawrence Livermore National Security, LLC, Livermore, CA (US)

( * ) Notice: Subject to any disclaimer, the term of this patent is extended or adjusted under 35 U.S.C. 154(b) by 1702 days.

(21) Appl. No.: 11/584,205

(22) Filed: Oct. 20, 2006

(65) Prior Publication Data

US 2007/0104399 A1    May 10, 2007

Related U.S. Application Data

(60) Provisional application No. 60/729,372, filed on Oct. 21, 2005.

(30) Foreign Application Priority Data

Dec. 20, 2005 (DE) .......................... 10 2005 060 883

(51) Int. Cl.
*F16C 33/00* (2006.01)
*C23C 16/458* (2006.01)
(Continued)

(52) U.S. Cl.
CPC ............ *C23C 16/458* (2013.01); *B43K 1/082* (2013.01); *C04B 35/52* (2013.01); *C23C 16/01* (2013.01); *C23C 16/271* (2013.01); *C23C 16/272* (2013.01); *C23C 16/274* (2013.01); *C23C 16/4417* (2013.01); *C30B 25/12* (2013.01); *C30B 25/18* (2013.01); *C30B 29/04* (2013.01); *C30B 29/607* (2013.01); *C30B 35/00* (2013.01); *G21B 1/19* (2013.01); *B22F 2998/00* (2013.01); *C04B 2235/427* (2013.01); *C04B 2235/6028* (2013.01); *C04B 2235/94* (2013.01); *C04B 2235/95* (2013.01); *C04B 2235/963* (2013.01); *C04B 2235/9661* (2013.01); *G02B 1/02* (2013.01)

(58) Field of Classification Search
None
See application file for complete search history.

(56) References Cited

U.S. PATENT DOCUMENTS 4,411,755 A * 10/1983 Herman et al. .......... 204/157.22
4,707,384 A    11/1987 Schachner et al.
(Continued)

FOREIGN PATENT DOCUMENTS

EP    0419087 A1 *    3/1991 ............. C23C 16/26

OTHER PUBLICATIONS

Matzen, M.K., "Status and plans of the United States ICF Program", Journal of Physics: Conference Series, vol. 112, pp. 012001-012004 (2008) (Fifth International Conference on Inertial Fusion Sciences and Applications (IFSA 2007), IOP Publishing Ltd.*
(Continued)

*Primary Examiner* — Johannes P Mondt
(74) *Attorney, Agent, or Firm* — Zilka-Kotab, PC

(57) ABSTRACT

A novel method for fabricating diamond shells is introduced. The fabrication of such shells is a multi-step process, which involves diamond chemical vapor deposition on predetermined mandrels followed by polishing, microfabrication of holes, and removal of the mandrel by an etch process. The resultant shells of the present invention can be configured with a surface roughness at the nanometer level (e.g., on the order of down to about 10 nm RMS) on a mm length scale, and exhibit excellent hardness/strength, and good transparency in the both the infra-red and visible. Specifically, a novel process is disclosed herein, which allows coating of spherical substrates with optical-quality diamond films or nanocrystalline diamond films.

15 Claims, 5 Drawing Sheets

(51) Int. Cl.

| | | |
|---|---|---|
| B43K 1/08 | (2006.01) | |
| C04B 35/52 | (2006.01) | |
| C23C 16/01 | (2006.01) | |
| C23C 16/27 | (2006.01) | |
| C23C 16/44 | (2006.01) | |
| C30B 25/12 | (2006.01) | |
| C30B 25/18 | (2006.01) | |
| C30B 29/04 | (2006.01) | |
| C30B 35/00 | (2006.01) | |
| C30B 29/60 | (2006.01) | |
| G21B 1/19 | (2006.01) | |
| G02B 1/02 | (2006.01) | |

(56) References Cited

U.S. PATENT DOCUMENTS

| | | | | |
|---|---|---|---|---|
| 5,869,133 | A | | 2/1999 | Anthony et al. |
| 6,132,278 | A | * | 10/2000 | Kang et al. ............ 445/14 |
| 6,610,095 | B1 | | 8/2003 | Pope et al. |
| 2002/0050161 | A1 | | 5/2002 | Warburton ............ 73/23.2 |
| 2008/0256850 | A1 | * | 10/2008 | Kley ............ 44/502 |

OTHER PUBLICATIONS

Lunn et al, "Growth of diamond films on spherical surfaces by hot filament CVD", Diamond and Related Materials, vol. 7, pp. 129-132 (1998).*

Ali et al, "Implementation of the time-modulated process to produce diamond films using microwave-plasma and hot-filament CVD systems", Vacuum, vol. 71, pp. 445-450 (2003).*

Lawson, J.D., Proceedings of the Physical Society B70, pp. 6-10 (1957).*

Artsimovich, L.A., "Controlled Thermonuclear reactions", Gordon and Breach Publishers, New York 1964 (First English Edition), pp. 1-9.*

Lister, J., Book Review of McCracken et al, "Fusion: The Energy of the Universe", Academic Press, Oxford 2005, Book Review published in Plasma Physics and Controlled Fusion, Institute of Physics Publishing, Ltd., vol. 48, pp. 715-716 (2006).*

Summary in "Plasma Science, Advancing Knowledge in the National Interest", National Research Council of the National Academies, May 2007 (pre-publication copy), i-xiv and pp. 15-45 (Exectuvie Summary).*

Lampe et al, "Comments on the Colliding Beam Fusion Reactor Proposed by Rostoker, Binderbauer and Monkhorst for use with the p—11B Fusion Reaction", Naval Research Laboratory Report NRL/MR/6709-98-8305.*

Broad, William J., The New York Times of May 25, 2009, "In Hot Pursuit of Fusion (or Folly)".*

"Blood", Black's Medical Dictionary (2010).*

German Office Action Summary from application No. 06 806 405.4-2122 mailed on Sep. 25, 2009.

Ali et al., "Implementation of the time-modulated process to produce diamond films using microwave-plasma and hot filament CVD systems" www.elsevier.com/locate/vacuum, Elsevier Science Ltd, 2003.

* cited by examiner

FABRICATION OF DIAMOND SHELLS

CROSS-REFERENCE TO RELATED APPLICATIONS

This application claims the benefit of U.S. Provisional Application No. 60/729,372, filed Oct. 21, 2005, entitled "Fabrication of Diamond Shells," and German Application No. 10 2005 060 883.3-45, filed 20 Dec. 2005, entitled, "Spherical Body with a Covering as well as a Method and Apparatus for Producing the Same," both of which are herein incorporated by reference in its entirety.

The United States Government has rights in this invention pursuant to Contract No. W-7405-ENG-48 between the United States Department of Energy and the University of Calif. for the operation of Lawrence Livermore National Laboratory.

BACKGROUND OF THE INVENTION

1. Field of the Invention

The present invention relates in general to shells of various shapes with a diamond covering, and more particularly to a method/system for producing substantially spherical nanocrystalline diamond shells often having a desired surface roughness at the nanometer level.

2. Description of Related Art

Sphere-like bearings are often subjected to radial loads in conventional configurations, often in configurations wherein the bearings undergo rolling motions and are maintained at an equivalent distance from each other. Since the sliding friction is extremely small, these bearings are frequently used in a rotary section of various types of machines.

Sphere-like shells having nuclear disposed fuel therein are also utilized for controlled thermonuclear fusion to address solutions to long term energy shortage problems. One problem in releasing fusion energy is to confine an intense hot plasma, for example, plasma of hydrogen isotopes deuterium-tritium, long enough for fusion reactions to take place. One technique, called laser fusion, utilizes high powered lasers to implode small fuel pellets, for example pellets of hydrogen isotopes deuterium-tritium, to thousands of times their normal liquid density and thereby initiate a fusion reaction. The laser light is focused onto a low density atmosphere of material as it evaporates from the surface of the pellet. This light is absorbed in the plasma atmosphere by electron-ion collisions or by plasma instabilities. In both cases the hot electrons travel in toward the center of the pellet and heat the pellet surface. The surface cools itself by ablation, i.e., by rapidly expelling material. This material traveling outward creates an equal and opposite force which compresses the pellet. The compression continues until the pressure created is greater than the ablation force.

One of the problems encountered in laser fusion is that plasma instabilities due to using high powered lasers tend to create extremely energetic electrons. These electrons can penetrate the core of the fuel pellet prematurely, thus making compression more difficult; a phenomenon called "preheat". These electrons also have a long range and therefore reduce the heat transfer between the pellet surface and the plasma atmosphere which results in uneven heating of the pellet, known as "decoupling".

The threshold for plasma instabilities can be increased by using hollow fuel shells. In such a case, the ablation pressure acts for a longer time and over a larger area and volume, so that less laser intensity is needed for implosion. However, a problem exists in producing hollow fuel pellets, ideally hollow spheres of the fuel material, which are of consistently uniform size, shape and thickness.

Accordingly, a need exists for an improved method/system for producing articles to be utilized in various applications that requires the covering be a hard material which resists abrasive degradation, with significant chemical stability, and is able to absorb large mechanical stresses or be optically transparent. The present invention is directed to such a need.

SUMMARY OF THE INVENTION

The present invention is directed to spherical shells having a closed and uniform layer of diamond having a surface roughness less than about 400 nm, wherein the interior can be filled with any desired substance. According to one embodiment, an article of manufacture comprises a shell enclosing a hollow volume; wherein a wall of the shell comprises a polycrystalline diamond film having a surface roughness less than about 400 nm.

Another aspect of the present invention is directed to a method of fabricating a diamond shell that includes: providing a substrate; symmetrically depositing a diamond film on the substrate; and removing the substrate so as to produce a hollow core.

A final aspect of the present invention is directed to a coating apparatus which includes a vacuum chamber, vacuum pump system, an arrangement for introducing one or more process gases, an arrangement for activating introduced process gases, and a substrate holder, wherein the holder includes a beveled rotating disk and a stationary outer ring defining a groove between the disk and the outer ring for receiving at one or more substrates as disclosed herein.

Accordingly, the present invention provides a desired system and method for producing diamond shell that can be used as, but not limited to, rolling bodies in ball bearings, pen-points, ornaments, or wherein the interior cavity can be filled with other materials for use as an inertial fusion target for energy production. Such shells as disclosed herein requires that the applied films be a hard material which resists abrasive degradation with significant chemical stability and that such shells be able to absorb large mechanical stresses or be optically transparent.

DETAILED DESCRIPTION OF THE INVENTION

Figure 1A:
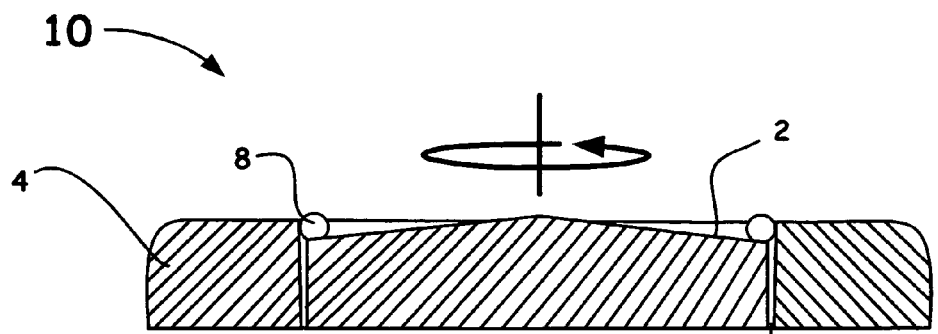
FIG. 1(a) illustrates a cross-sectional view of an example beneficial substrate coating platform of the present invention.

Referring now to the following detailed information, and to incorporated materials; a detailed description of the invention, including specific embodiments, is presented.

Unless otherwise indicated, numbers expressing quantities of ingredients, constituents, reaction conditions and so forth used in the specification and claims are to be understood as being modified by the term "about." Accordingly, unless indicated to the contrary, the numerical parameters set forth in the specification and attached claims are approximations that may vary depending upon the desired properties sought to be obtained by the subject matter presented herein. At the very least, and not as an attempt to limit the application of the doctrine of equivalents to the scope of the claims, each numerical parameter should at least be construed in light of the number of reported significant digits and by applying ordinary rounding techniques. Notwithstanding that the numerical ranges and parameters setting forth the broad scope of the subject matter presented herein are approximations, the numerical values set forth in the specific examples are reported as precisely as possible. Any numerical value, however, inherently contains certain errors necessarily resulting from the standard deviation found in their respective testing measurements.

General Description

As disclosed herein, deposition of diamond films on spherical substrates, often spherical silicon substrates having diameters ranging from about 0.3 mm up to about 10 mm, is performed by depositing the diamond directly from a gas phase onto the substrate. Such a method is achieved by introducing the substrate into an atmosphere of hydrogen, which also contains gaseous carbohydrates, such as, but not limited to, methane or acetylene.

The system for providing the articles of the present invention is equipped with a novel substrate holder to guarantee the uniform and conformal coating of the disclosed spherical substrates. The substrate platform includes a rotating beveled inner disk and a stationary outer ring whereby the arranged substrates are randomly rotated to randomize their movement while seated in the groove between the inner disk and the outer ring. After every turn, the spheres are deflected from the groove to further randomize their movement. The diamond films, which are configured as the walls of the shells of the present invention are grown between about 600° C. and about 1000° C. using a feed gas mixture of about 1% to about 3% methane in hydrogen, which also contains gaseous carbohydrates, such as, but not limited to, methane or acetylene, resulting in a deposition rate of approximately 2 μm/h.

The grain size influences the surface roughness and the quality of the diamond films. For example, coarse-grained material exhibits peak-to-valley surface roughness values up to 30% of the film thickness, whereas nanocrystalline material tends to develop voids. The grain size is controlled by adjusting the secondary nucleation rate, wherein a low secondary nucleation rate leads to the deposition of coarse-grained material, whereas a high secondary nucleation rate leads to the formation of fine grained or nanocrystalline material. The secondary nucleation rate depends on the plasma chemistry; a high methane partial pressure and the controlled addition of impurities such as nitrogen and oxygen to promote secondary nucleation.

In order to remove the substrates, micron-sized holes having diameters from about 5 micrometers and up to about 200 micrometers are drilled through the now configured diamond film using, for example, focused-ion-beam (FIB) etching, such as $XeF_2$-assisted FIB techniques as disclosed in, "Focused-ion-beam-assisted etching of diamond in XeF2," by J. Taniguchi et al., Journal of Vacuum Science & Technology B 16(4), 2506-2510 (1998), and techniques as disclosed in, "Patterning of diamond and amorphous carbon films using focused ion beams," by A. Stanishevsky, Thin Solid Films 398, 560-565 (2001)), the disclosures of which are herein incorporated by reference in its entirety.

As another beneficial method, holes of similar or better quality can be drilled within a few seconds by using a directed optical source, such as a laser source, more often, a diode pumped, nano-second Nd:YAG laser with a 4 kHz pulse repetition rate and an average power of 10 W. Fine-grained material is better suited for this beneficial technique, as it allows for a better coupling with the laser light during the initial stage of hole drilling. While such an Nd:YAG source is a beneficial optical source, other optical sources, such as, but not limited to, Ti:Sapphire, Cr:LiSAF, Yb:YAG, Yb:YLF, Chirped Pulse Amplification (CPA) systems, optical parametric amplifier systems, hybrid systems based on such, excimer lasers, Q-switched solid state lasers (both fundamental wavelength and frequency multiplied), and mode locked solid state lasers may also be employed without departing form the scope and spirit of the present invention.

In order to remove the substrate through the configured micron-sized holes, wet etch methods can be employed using ultrasonic sound to increase the etch rate. A low-viscosity etch solution based on HF and $HNO_3$ can be used to further facilitate mass transport. Ultra-sound not only increases the etch rate by supplying energy; more importantly, the ultrasound also suppresses bubble formation whereby facilitating mass transport through the narrow holes. Using this ultrasonically enhanced wet etch approach enables the removal of the substrates through a produced hole(s) in a few hours or days depending on the concentration gradient of the dissolved silicon and the diameter of the hole.

Accordingly, the present invention enables the production of shells configured of a hard material which can resist abrasive degradation, and/or that can have significant chemical stability and/or that can absorb large mechanical stresses and/or be optically transparent. Applications of such articles of the present invention, include, but are not limited to, ball bearings, hard non-degradable surfaces for pen-points configured in ball-point pens, or a spherical shell configured as an inertial confinement fusion target.

Specific Description

Figure 1B:
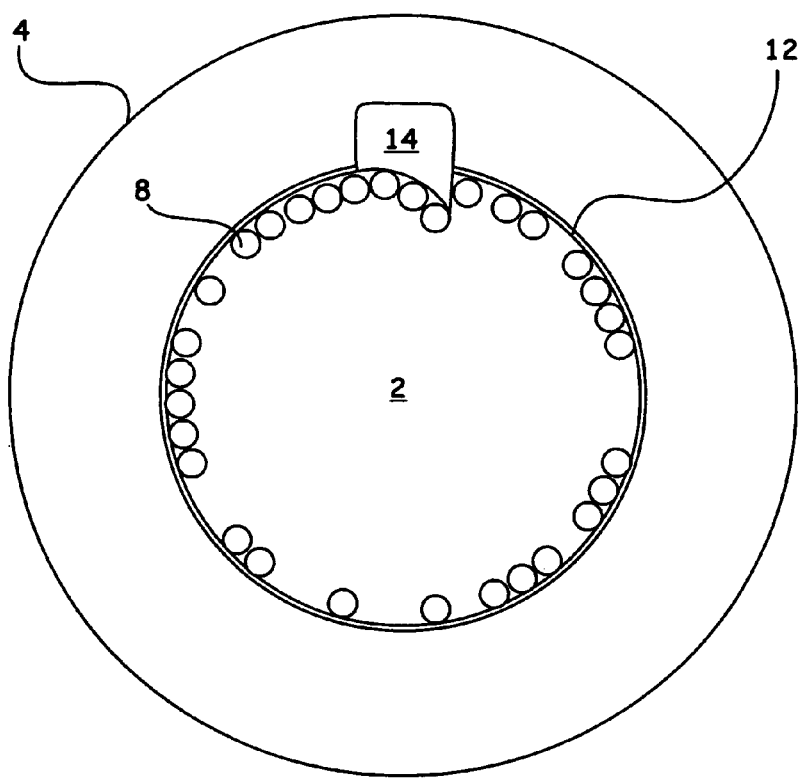
FIG. 1(b) illustrates a top-down view of an example beneficial substrate coating platform of the present invention.

Turning now to the drawings, FIG. 1(a) illustrates a cross-sectional view of an example beneficial substrate coating platform of the present invention and is generally designated as reference numeral 10. The substrate coating platform 10 includes a beveled rotating disk 2 and a stationary outer ring 4. One or more substrates 8, e.g., one or more silicon substrate spheres, rotate in a groove 12 caused by the rotation of beveled rotating disk 2 (rotation denoted by the directional arrow). Such an apparatus is configured in a desired plasma reactor (not shown), such as, for example, a plasma reactor as described in German Patent No. DE19507077 C1, which is herein incorporated by reference in its entirety, to enable the uniform and conformal coating of the disclosed spherical substrates 8. In order to change the axis of rotation of the substrates 8, they are diverted with each revolution by a diverter element 14 as shown in the top down view of FIG. 1(b), which deflects the substrates 8 from groove 12 towards the center of the beveled rotating disk 2 while stationary outer ring 4 prevents the escape of individual substrates 8. When the substrates 8 roll back they turn about a different axis compared to the previous movement within the groove. Such an arrangement provides for every part of the surface of a substrate 8 to be exposed to the activated gas phase for the same time period and the deposition takes phase uniformly over the entire surface of the substrate.

As an additional method arrangement, a random movement of the substrates 8 can be achieved by driving the platform at changing directions and speeds. The change in the axis in the rotational axis of the substrate can be achieved by providing an arrangement which permits detecting the substrates 8 out of groove 12. When the substrates roll back into the groove, their original rotational axis is changed. Accordingly, such methods and arrangements cause a very uniform deposition of the carrier (i.e., the diamond coating) with a thickness variation of less than about 1%.

The diamond deposition occurs between about 600 degrees C. and about 1000 degrees C. under a gas atmosphere of for example, 1% methane in hydrogen. As an example arrangement, at a microwave output of 5 kilowatts a diamond layer can be deposited at a rate of 1 to 2 micrometers per hour to form a diamond shell of 70 micrometers. One of ordinary skill in the art is familiar with the fact that diamond deposited in such a manner contains hydrogen as well as other impurities in addition to carbon. The impurities can include argon, oxygen, and nitrogen. In addition, boron, nitrogen, sulfur, tungsten, tantalum, and/or phosphorus can also be included as dopants. Such dopants influence the electrical conductivity of the deposited diamond and can influence the speed of crystal growth as well as the orientation of the growing crystals in addition to influencing the optical appearance of the diamond layer.

Additional imperfections could be that the diamond has grain boundaries and graphitic regions, so that, on closer inspection the layer does not include of 100% diamond. In addition, the deposited material, according to the present invention, can be distinguished from layers containing diamond, where diamond particles are dispersed in a metallic or polymer binder and which can be formed into surfaces of arbitrary shapes in accordance with the state of the art.

The spherical shells according to the present invention can deviate from an ideal spherical shape and may, for example, be shortened or stretched in a given direction. In such a case, one may obtain the form of an ellipsoid, for example an ellipsoid of revolution. Also, the body of the invention does necessarily have a uniform curvature of its convex outer surface. Moreover the bodies of the invention may have the form of a multifaceted body, (e.g., tetrahedron, dodecahedron, ikosahedron) as well as archimedian bodies (kubokahedron). A spherical shape in the sense of this invention means any outer surface which is a closed curve and can be drawn to a point on the surface of this sphere.

The present invention enables the manufacturing of spherical shells of arbitrary sizes to be produced having preferable diameters ranging from about 0.3 mm up to about 10 mm. Such shells can be used, for example, as ornaments, or as rolling bodies to be utilized as ball bearings or as a target for inertial confinement fusion or the invention can be utilized as a pen-point for a ball-point pen. Such a ball-point pen arrangement reduces wear on the main body of the pen-point of a conventional ball-point pen so as to maintain good writing performance for a longer term, even if high viscosity gel inks with heavy and hard inorganic pigments are employed. Moreover, the spherical bodies disclosed herein are also very beneficial as targets for inertial confinement fusion.

The spherical substrates used for the present coatings may include either metal or an alloy or a ceramic, especially molybdenum or silicon nitride, more often the substrates are desired to be silicon because of the ease of applying coatings of the present invention to silicon substrates. Moreover silicon is especially suitable for producing hollow spheres.

Depending on the desired application of the spherical body, the substrate may be subjected to a seeding step prior to depositing the diamond coating. For example, diamond dust may be applied to the substrate for seeding purposes. The diamond dust in turn can be applied to the substrate by rolling or by air pressure impaction. Especially preferred is a seeding by means of Bias Enhanced Nucleation as disclosed in EP0663023 A1, herein disclosed by reference in its entirety. By such a pretreatment, the quality and adhesion of the diamond layer is desirably increased.

In order to deposit a layer of particularly uniform thickness, a substrate is rotated during the seeding and/or the deposition process. It is beneficial to utilize a random rotation where the axis of rotation undergoes multiple changes. Thereby a uniform deposition is maintained covering points lying on the axis.

The diamond shells according to this invention can achieve a thickness uniformity of +/−1% or better with an inhomogeneity deviation from a specified thickness over a larger area of about 5% to about 20% of the surface.

A beneficial embodiment relates to providing a diamond material having polycrystalline diamond (i.e., nanocrystalline diamond). The size of the individual crystals may vary between about a few nanometers (nm) and about a few micrometers (μm). The individual crystals can have a random or a uniform orientation such that the surface shows the same crystal faces. In the choice of optimal crystal size the expert/operator can weigh the better mechanical properties of nanocrystalline materials against the better heat conductivity and optimal transparency of coarser grain diamond material.

The surface roughness of the diamond can be configured with an RMS roughness of less than about 200 nm, often down to about 10 nm and more often between about 10 nm and about 75 nm. The thickness of the diamond coverings of this invention is often arranged between about 5 micrometers and about 1000 micrometers, more often from about 10 micrometers up to about 200 micrometers. Such surface roughness and thickness parameters can be chosen by the practitioner depending on the planned application of the diamond bodies. In particular the practitioner considers the mechanical stresses, abrasion and surface quality into account.

Figure 2:
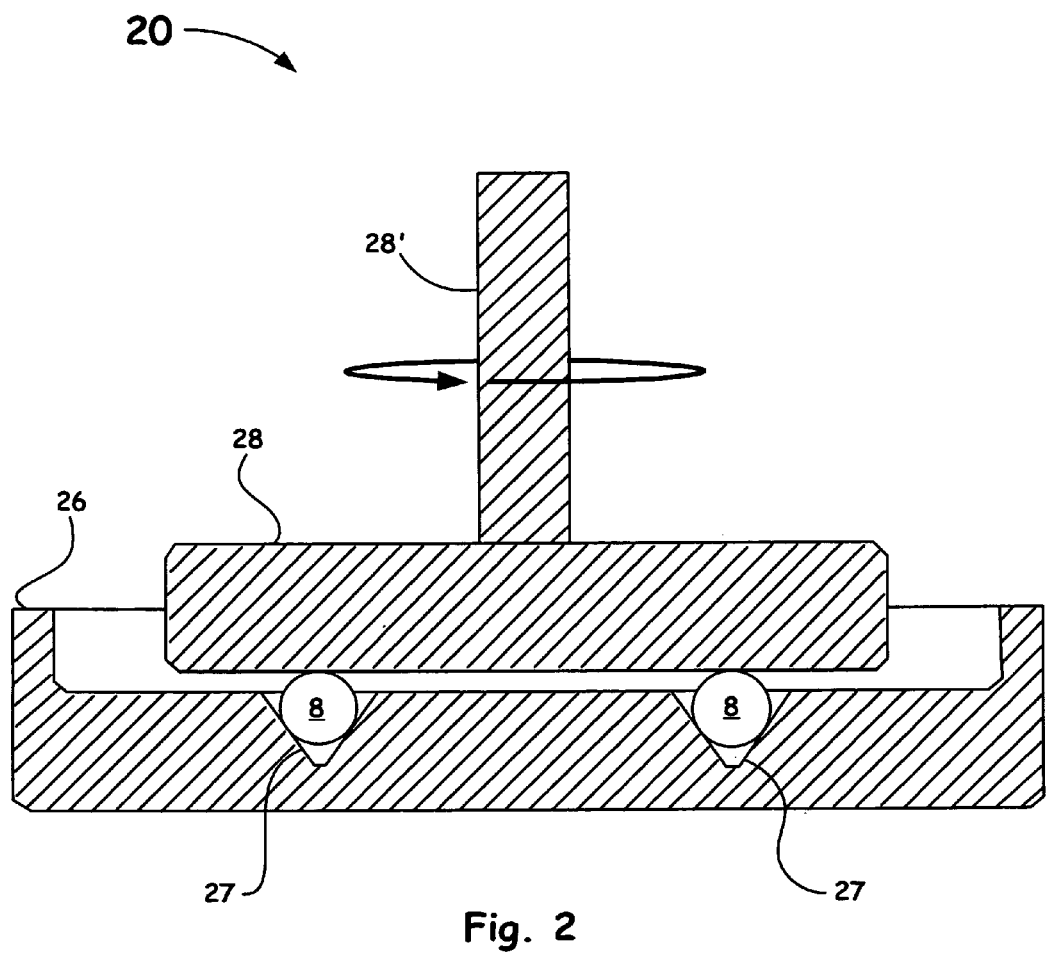
FIG. 2 illustrates an example polishing apparatus for shells of the present invention.

Returning to the drawings, FIG. 2 shows an example polishing apparatus, generally designated by the reference numeral 20, utilized to reduce the surface roughness of produced shells using the apparatus of FIG. 1. Such a polishing apparatus 20 comprises a holder 26 with one or more concentric grooves 27 for holding the diamond coated spherical shells 8 to be polished. Thereafter a polishing disk 28 with a polishing compound, such as, a diamond powder (not shown), is brought into contact with holder 26 and rotated about an axis (as denoted with the rotational arrow) via, for example, a spindle 28'. Such a procedure enables the initial coating (e.g., a coating having a 2 micrometer RMS) to be reduced to the disclosed surface roughness specifications as disclosed above, e.g., of less than about 200 nm, often down to about 10 nanometers and more often between about 10 nanometers and about 75 nanometers.

Figure 3A:
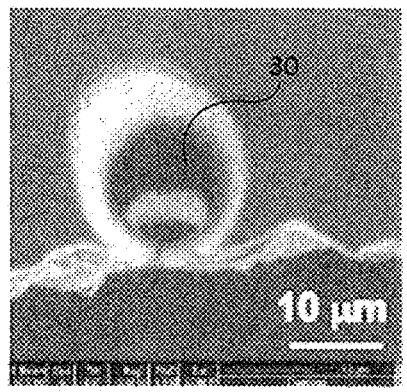
FIG. 3(a) shows an example top-down-view photograph of a 90-micron-thick shell perforated by means of a focused ion beam under a xenondifluoride ($XeF_2$) atmosphere.
Figure 3B:
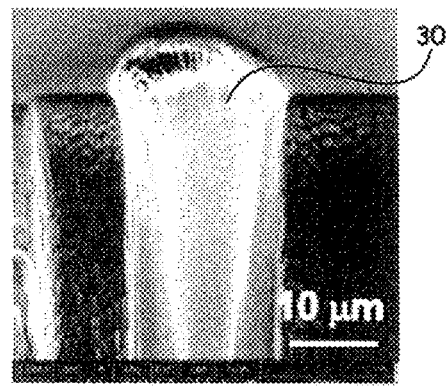
FIG. 3(b) shows a cross-section of the 90-micron-thick shell perforated by means of a focused ion beam under a xenondifluoride ($XeF_2$) atmosphere.

The configured shells of the present invention may have one or more perforations or drill holes. These may be feed-through drillings or partially penetrating recesses. These holes are often formed by material removal using focused ion beams or by laser irradiation. FIGS. 3(a)-(g) shows graphic and proof of principle example embodiments of perforations realized by methods of the present invention. For example, FIG. 3(a) shows an example photograph of a 90-micron-thick shell perforated by means of a focused ion beam under a xenondifluoride ($XeF_2$) atmosphere so as to increase the physical sputter yield by up to about a factor of six. The opening 30 has a diameter of about 12 micrometers at its surface which is reduced to about 5 micrometers with a depth of the diamond layer. The diamond material is removed at a rate of about 2 micrometers per minute. FIG. 3(b) shows a cross-section of the same opening 30 performed by Focused Ion Beam Etching.

Alternately, as discussed above, optical irradiation, such as irradiation provided by a diode pumped, nano-second Nd:YAG laser with a 4 kHz pulse repetition rate and an average power of 10 W, can be utilized to form smaller holes which penetrate the diamond layer and/or the substrate uniformly so as to produce holes between about 5 micrometers and up to about 200 micrometers.

Figure 3C:
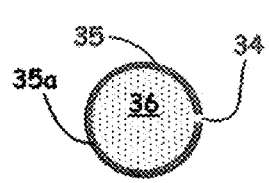
FIG. 3(c) shows a basic side view of an optically created single perforation in the shell of the present invention.
Figure 3D:
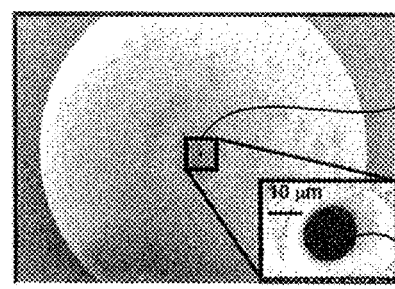
FIG. 3(d) shows a proof of principle single perforation through a shell using optical irradiation directed from a mode locked Nd:Yag optical source.

FIG. 3(c) shows a basic side view of, for example, an optically created single perforation 34 in a wall 35a of a shell 35 of the present invention, the wall 35a having a layer of diamond (diamond layer), while not penetrating therethrough the silicon substrate 36. FIG. 3(d) shows a proof of principle single perforation 34' (shown within the square for clarity) using optical irradiation directed from a mode locked Nd:Yag having an output power of 15 watts at a 4 kHz pulse repetition rate. The perforation 34", as shown in the inset picture, produced by such an optical treatment has a diameter of about 25 micrometers which is reduced to 5 micrometers over the thickness of the diamond layer. This reduction in diameter is caused by self focusing non-linear effects of the directed optical radiation.

Figure 3H:
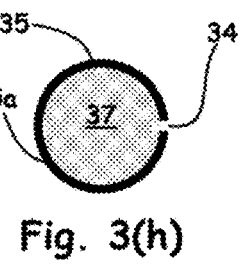
FIG. 3(h) shows a basic side view of an optically created single perforation in the shell of the present invention.
Figure 3F:
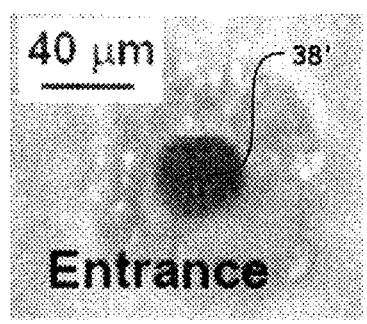
FIG. 3(f) shows a proof of principle entrance perforation of a perforation therethrough the shell and the silicon substrate using optical irradiation directed from a mode locked Nd:Yag optical source.
Figure 3E:
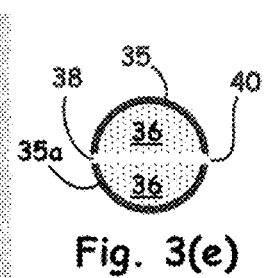
FIG. 3(e) shows a basic side view of an optically created perforation therethrough the shell and the silicon substrate.
Figure 3G:
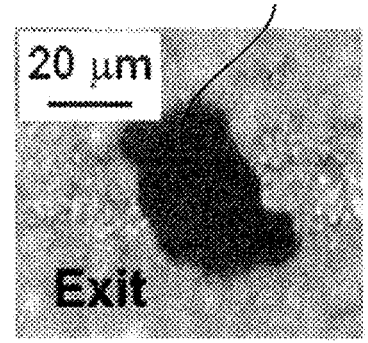
FIG. 3(g) shows a proof of principle exit perforation of a perforation therethrough the shell and the silicon substrate using optical irradiation directed from a mode locked Nd:Yag optical source.
Figure 3I:
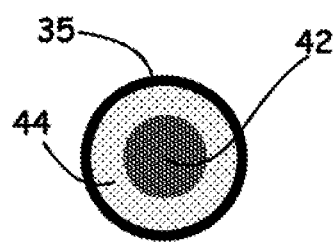
FIG. 3(i) shows a basic side view of a shell having a frozen layer of DT fuel and a central DT gas core.

FIG. 3(e) shows a basic side view of an optically created perforation therethrough the shell 35 and the silicon substrate 36, wherein reference numeral 38 denotes a front perforation and reference numeral 40 denotes an exit perforation. FIG. 3(f) shows a proof of principle entrance perforation 38' while FIG. 3(g) shows the exit perforation 40' of about 30 micrometers through the shell 35, a wall 35a of the shell 35 having a layer of diamond, and the silicon substrate 36, as shown in FIG. 3(e) of the shell of the present invention. FIG. 3(h) shows a basic side view of, for example, an optically created single perforation 34 in a wall 35a of a shell 35, according to one embodiment. The wall 35a has a diamond layer, and the substrate (FIG. 3(c), 36) has been removed, thereby allowing the hollow sphere to be filled with a fusion fuel 37, such as a frozen layer of deuterium-tritium (DT) fuel with a central DT gas core, a DT fuel in a solid, liquid or gaseous form, a deuterium fuel, a tritium fuel, as shown in FIG. 3(h). FIG. 3(i) shows a shell 35 with a frozen layer of DT fuel 42 and a central DT gas core 44.

Such holes are desired for removing the core, i.e., the substrate, of the spherical diamond shell in order to form a hollow body. According to some embodiments, the enclosed hollow body or hollow volume may have a length of between about 0.3 mm and about 5 mm along a long dimension, e.g., an internal diameter of the spherical hollow body. The removal of the core of the spherical diamond shell is preferably accomplished by wet or dry etching. For wet etching one can use for example a mixture of hydrogen fluoride and nitric acid. Such a solution can remove, for example, a silicon core from a spherical diamond shell within a few hours or days depending on the concentration gradient of the dissolved silicon and the diameter of the hole. The diffusion of the silicon into the etch solution and through the drill hole can be accelerated by means of ultrasound using ultrasound baths known in the art. For accelerating this process further one can, of course, use a drill hole through the entire spherical shell and flowing etch solution through it.

As an alternative, dry chemical etch procedures for silicon using xenon difluoride can also be utilized. In order to remove large amounts through drillings as small as possible, the dry chemical etching is carried out in a pulsed fashion. To do so the body is impacted with $XeF_2$ and thereafter exposed to a vacuum. These steps are carried out alternately until the core has been removed.

Such a hollow diamond shell appears optically translucent or transparent, depending on sufficient diamond quality and small surface roughness and accordingly can be used as a refractive optical element or as a piece of jewelry. It is also possible to refill the hollow diamond body through the existing drillings with a nuclear fuel such as, deuterium and tritium in solid or liquid form so as to produce a target for inertial confinement fusion. After filling, the drill holes can be resealed. This is done with frozen deuterium or with diamond like carbon applied in the region of the opening with a local CVD process by means of a focused ion beam. Diamond shells closed by such means can even be stored at room temperature.

As another example method and as discussed above in the general discussion section, the silicon core of a diamond shell as disclosed herein can be removed in a mixture of nitric acid ($HNO_3$) and hydrofluoric acid (HF) to further facilitate mass transport. After several days the silicon substrate can be completely decomposed so as to result in a hollow diamond shell.

Figure 4:
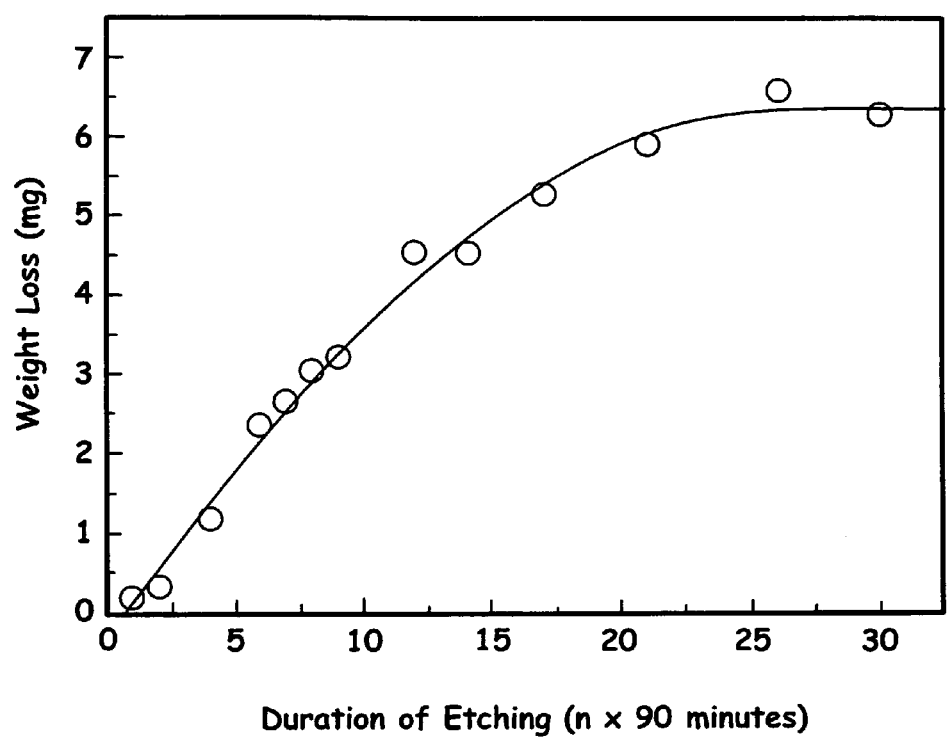
FIG. 4 shows a plot of weight loss of the cores within the diamond shells compared to the duration of the etching so as to illustrate the influence of using ultrasound to accelerate the etch process.

Moreover, ultra-sound can be utilized in conjunction with the mixture of nitric acid ($HNO_3$) and hydrofluoric acid (HF) to further increase the etch rate by supplying energy and to suppress bubble formation to further facilitate mass transport through the narrow holes. FIG. 4 shows a plot of weight loss of the cores within the diamond shells compared to the duration of the etching so as to illustrate the influence of using ultrasound to accelerate the etch process. Accordingly, FIG. 4 shows that the silicon core (as denoted by circles in FIG. 4) can be completely removed in less than 40 hours from the configured perforations as disclosed herein without a complicated apparatus.

In another example embodiment of removing the cores of the present invention, a diamond sphere configured with a through-hole, as shown in FIG. 4(e) and as discussed above, can be transformed into a hollow diamond body by coupling one end of the through-hole to a vacuum pump system. Such an arrangement enables a laminar flow of the etch solution to be produced through the core of the diamond body so that the mass transport takes place not by diffusion but by flow and thus removes the silicon substrate in a considerably shorter time period.

As generally discussed above, the core of the diamond shells can also be removed by a dry etch process. As an example to illustrate the principle, a focused-ion-beam is turned off after creating a perforation in a shell while in a XeF2. atmosphere (see XeF$_2$-assisted FIB techniques as disclosed in, "Focused-ion-beam-assisted etching of diamond in XeF2," by J. Taniguchi et al., Journal of Vacuum Science & Technology B 16(4), 2506-2510 (1998)). The XeF2 atmosphere etches only the silicon core without attacking the diamond shell layer. In order to facilitate the transport of the etched silicon material through the perforation the XeF2 is pumped away after several minutes. The recipient is thereafter again flooded with XeF$_2$. By this process it is possible to achieve etch rates of 10 micrometers per minute.

It is also to be appreciated that the configured hollow diamond shell(s) as disclosed herein can also be configured as an inertial confinement fusion target. For this purpose the hollow sphere can be placed in an atmosphere containing phenanthren ($C_{14}H_{10}$) and activated locally in the region of the access hole by means of a focused ion beam. Thereby a pipe-like structure of diamond-like carbon forms directly above the opening. This is connected to the diamond surface without glue or other impurities. Through this pipe-like structure it is possible to then fill the interior of the sphere with a gas or liquid combination of deuterium and tritium. By reducing the temperature of the hollow shell below the melting point of deuterium and tritium, the latter is caused to freeze in the interior of the hollow sphere. In such a manner it is possible to introduce larger quantities of deuterium and tritium into the hollow body. After completing the fill process the pipe-like structure is removed by means of a focused ion beam. The aperture is closed again by focusing an ion beam on the opening in a $C_{14}H_{10}$ atmosphere.

As another arrangement, a silicon carrier can be provided with a covering of fine diamond crystals. In principle, this has the same columnar structure as the configured diamond layers as discussed above. However this grain structure is smaller by a factor of about 10 to about 100. To deposit this diamond layer, a silicon substrate is brought into a microwave plasma. A mixture of methane, oxygen and hydrogen is used as process gas. The concentration of methane is increased in regular intervals by a periodic increase of the flow of methane which causes secondary nucleation and thereby the deposition of fine grain structures. The deposition rate of the fine grain diamond material can be at a rate of about 0.5 to about 1 micrometers per hour. Such an example method application produces shells having an RMS roughness of about 400 nanometers. Moreover, as a result of the small grain size, the produced diamond layer has an isotropic sound speed, so that sound waves spread through the layer in the form of rings. A shock front would therefore not be deformed as a result of traversing the diamond cover.

Changes and modifications in the specifically described embodiments can be carried out without departing from the scope of the invention, which is intended to be limited by the scope of the appended claims.

The invention claimed is:

1. An article of manufacture, comprising:
a shell enclosing a hollow volume;
the shell having a polycrystalline diamond film having a surface roughness less than about 400 nm,
wherein the hollow volume has a length of between 2 mm and about 5 mm along a long dimension, and
wherein the diamond film is capable of isotropic transmission of sound, wherein said diamond film further comprises a dopant, wherein said dopant is at least one element selected from a list consisting of: hydrogen, carbon, argon, boron, oxygen, nitrogen, sulfur, tungsten, tantalum, and phosphorus.

2. An article of manufacture, comprising:
a shell enclosing a volume, the shell having a polycrystalline diamond film having a surface roughness less than about 400 nm,
at least one perforation in the shell; and
at least one of:
at least one closure closing the at least one perforation, wherein the at least one closure comprises a material selected from the group consisting of: deuterium, tritium, and deuterium-tritium; and
at least one fill tube comprising diamond-like carbon forming a glueless joint to the at least one perforation,
wherein the diamond film is capable of isotropic transmission of sound, and
wherein at least one filling selected from a solid and a fluid is disposed in said volume, the solid or fluid being different than a substrate around which the shell was formed, wherein at least one fusion fuel selected from deuterium and tritium is disposed in said volume, wherein each fusion fuel of the at least one fusion fuel is substantially free of oxygen, and wherein said fusion fuel is pressurized at greater than about 1 atm.

3. An article of manufacture, comprising:
a shell enclosing a hollow volume;
the shell having a polycrystalline diamond film having a surface roughness less than about 400 nm,
wherein the hollow volume has a length of between 2 mm and 5 mm along a long dimension, and wherein the diamond film is capable of isotropic transmission of sound; wherein the article further comprises at least one perforation in the shell and a closure closing the at least one perforation, and wherein the material of the closure comprises diamond-like carbon.

4. An article of manufacture comprising:
a shell enclosing a hollow volume;
at least one perforation in the shell; and
at least one closure closing the at least one perforation in the shell, a material of the closure comprising solid deuterium,
wherein the shell comprises a polycrystalline diamond film having a surface roughness of between about 10 nm and about 75 nm,
wherein the diamond film has a diamond grain size characteristic of being formed in a microwave plasma,
wherein the diamond film is capable of isotropic transmission of sound,
wherein the shell has a thickness of between about 5 microns and about 200 microns and has a thickness uniformity of better than about +/−1%, and wherein the at least one perforation has a diameter of between about 5 micrometers and about 200 micrometers.

5. An article of manufacture, comprising:
a shell enclosing a volume, the shell having a polycrystalline diamond film having a surface roughness less than about 400 nm,
at least one perforation in the shell; and
at least one of:
at least one closure closing the at least one perforation, wherein the at least one closure comprises a material selected from the group consisting of: deuterium, tritium, and deuterium-tritium; and
at least one fill tube comprising diamond-like carbon forming a glueless joint to the at least one perforation,
wherein the diamond film is capable of isotropic transmission of sound, and
wherein at least one filling selected from a solid and a fluid is disposed in said volume, the solid or fluid being different from a substrate around which the shell was formed, wherein said diamond film further comprises a dopant.

6. The article of claim 5, wherein said dopant comprises up to about 5% of the atomic fraction of the diamond film.

7. The article of claim 5, wherein said dopant is at least one element selected from a list consisting of: hydrogen, carbon, argon, boron, oxygen, nitrogen, sulfur, tungsten, tantalum, and phosphorus.

8. An article of manufacture, comprising:
a shell enclosing a volume, the shell having a polycrystalline diamond film having a surface roughness less than about 400 nm,
at least one perforation in the shell; and
at least one of:
at least one closure closing the at least one perforation, wherein the at least one closure comprises a material selected from the group consisting of: deuterium, tritium, and deuterium-tritium; and
at least one fill tube comprising diamond-like carbon forming a glueless joint to the at least one perforation,
wherein the diamond film is capable of isotropic transmission of sound, and
wherein at least one filling selected from a solid and a fluid is disposed in said volume, the solid or fluid being different from a substrate around which the shell was formed, wherein said diamond film has a surface roughness of less than about 200 nm.

9. An article of manufacture, comprising:
a shell enclosing a volume, the shell having a polycrystalline diamond film having a surface roughness less than about 400 nm,
at least one perforation in the shell; and
at least one of:
at least one closure closing the at least one perforation, wherein the at least one closure comprises a material selected from the group consisting of: deuterium, tritium, and deuterium-tritium; and
at least one fill tube comprising diamond-like carbon forming a glueless joint to the at least one perforation,
wherein the diamond film is capable of isotropic transmission of sound, and
wherein at least one filling selected from a solid and a fluid is disposed in said volume, the solid or fluid being different from a substrate around which the shell was formed, wherein said diamond film has a surface roughness of between about 10 nm and about 75 nm.

10. An article of manufacture, comprising:
a shell enclosing a volume, the shell having a polycrystalline diamond film having a surface roughness less than about 400 nm,
at least one perforation in the shell; and
at least one of:
at least one closure closing the at least one perforation, wherein the at least one closure comprises a material selected from the group consisting of: deuterium, tritium, and deuterium-tritium; and
at least one fill tube comprising diamond-like carbon forming a glueless joint to the at least one perforation,
wherein the diamond film is capable of isotropic transmission of sound, and
wherein at least one filling selected from a solid and a fluid is disposed in said volume, the solid or fluid being different from a substrate around which the shell was formed, wherein said diamond film has physical characteristics of being formed in a microwave plasma.

11. An article of manufacture, comprising:
a shell enclosing a volume, the shell having a polycrystalline diamond film having a surface roughness less than about 400 nm,
at least one perforation in the shell; and
at least one of:
at least one closure closing the at least one perforation, wherein the at least one closure comprises a material selected from the group consisting of: deuterium, tritium, and deuterium-tritium; and
at least one fill tube comprising diamond-like carbon forming a glueless joint to the at least one perforation,
wherein the diamond film is capable of isotropic transmission of sound, and
wherein at least one filling selected from a solid and a fluid is disposed in said volume, the solid or fluid being different from a substrate around which the shell was formed, wherein said shell has a thickness from about 5 microns to about 1000 microns.

12. An article of manufacture, comprising:
a shell enclosing a volume, the shell having a polycrystalline diamond film having a surface roughness less than about 400 nm,
at least one perforation in the shell; and
at least one of:
at least one closure closing the at least one perforation, wherein the at least one closure comprises a material selected from the group consisting of: deuterium, tritium, and deuterium-tritium; and
at least one fill tube comprising diamond-like carbon forming a glueless joint to the at least one perforation,
wherein the diamond film is capable of isotropic transmission of sound, and
wherein at least one filling selected from a solid and a fluid is disposed in said volume, the solid or fluid being different from a substrate around which the shell was formed, wherein said shell has a thickness from about 10 micrometers to about 200 micrometers.

13. An article of manufacture, comprising:
a shell enclosing a volume, the shell having a polycrystalline diamond film having a surface roughness less than about 400 nm,
at least one perforation in the shell; and
at least one of:
at least one closure closing the at least one perforation, wherein the at least one closure comprises a material selected from the group consisting of: deuterium, tritium, and deuterium-tritium; and at least one fill tube comprising diamond-like carbon forming a glueless joint to the at least one perforation, wherein the diamond film is capable of isotropic transmission of sound, and wherein at least one filling selected from a solid and a fluid is disposed in said volume, the solid or fluid being different from a substrate around which the shell was formed, wherein said shell has a thickness uniformity of better than about +/−1%.

14. An article of manufacture, comprising:

a shell enclosing a volume, the shell having a polycrystalline diamond film having a surface roughness less than about 400 nm, at least one perforation in the shell; and at least one of:

at least one closure closing the at least one perforation, wherein the at least one closure comprises a material selected from the group consisting of: deuterium, tritium, and deuterium-tritium; and at least one fill tube comprising diamond-like carbon forming a glueless joint to the at least one perforation, wherein the diamond film is capable of isotropic transmission of sound, and wherein at least one filling selected from a solid and a fluid is disposed in said volume, the solid or fluid being different from a substrate around which the shell was formed, wherein the at least one perforation has a diameter of between about 5 micrometers and about 200 micrometers.

15. An article of manufacture, comprising:

a shell enclosing a volume, the shell having a polycrystalline diamond film having a surface roughness less than about 400 nm, at least one perforation in the shell; and at least one of:

at least one closure closing the at least one perforation, wherein the at least one closure comprises a material selected from the group consisting of: deuterium, tritium, and deuterium-tritium; and at least one fill tube comprising diamond-like carbon forming a glueless joint to the at least one perforation, wherein the diamond film is capable of isotropic transmission of sound, and wherein at least one filling selected from a solid and a fluid is disposed in said volume, the solid or fluid being different from a substrate around which the shell was formed, wherein said filling comprises a frozen layer of deuterium-tritium (DT) fuel and a central DT gas core.

* * * * *